United States Patent
Choi et al.

(10) Patent No.: US 7,659,773 B2
(45) Date of Patent: Feb. 9, 2010

(54) SEMICONDUCTOR INTEGRATED CIRCUIT DEVICE AND POWER CONTROL METHOD THEREOF

(75) Inventors: Chang-Jun Choi, Hwaseong-si (KR); Suhwan Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/022,680

(22) Filed: Jan. 30, 2008

(65) Prior Publication Data

US 2008/0180157 A1    Jul. 31, 2008

(30) Foreign Application Priority Data

Jan. 31, 2007    (KR)    .................... 10-2007-0010156

(51) Int. Cl.
*G05F 1/10*    (2006.01)
*G05F 3/02*    (2006.01)

(52) U.S. Cl. .................. 327/544; 327/142; 327/143
(58) Field of Classification Search .............. 327/142
See application file for complete search history.

(56) References Cited

U.S. PATENT DOCUMENTS 7,002,381 B1 *   2/2006   Chung ................. 327/131
2006/0119393 A1    6/2006   Hua et al.

FOREIGN PATENT DOCUMENTS

JP    2004-201268    7/2004
JP    2006-042304    2/2006

* cited by examiner

*Primary Examiner*—Lincoln Donovan
*Assistant Examiner*—Daniel Rojas
(74) *Attorney, Agent, or Firm*—F. Chau & Associates, LLC

(57) ABSTRACT

A semiconductor IC includes a logic block, and a voltage control circuit controlling an operating voltage supplied into the logic block. The voltage control circuit controls the operating voltage to be increased in a stepwise fashion during an initial operation of the logic block.

4 Claims, 12 Drawing Sheets

SEMICONDUCTOR INTEGRATED CIRCUIT DEVICE AND POWER CONTROL METHOD THEREOF

CROSS-REFERENCE TO RELATED APPLICATION

This U.S. non-provisional patent application claims priority under 35 U.S.C. § 119 of Korean Patent Application No. 10-2007-0010156 filed on Jan. 31, 2007, the entire contents of which are incorporated herein by reference.

BACKGROUND

The present disclosure relates to semiconductor integrated circuits and, more particularly, to a semiconductor integrated circuit (IC) capable of reducing leakage currents.

Upon approaching microscopic processing levels with the dimensions of tens of nanometers in semiconductor IC fabrication technology, semiconductor IC devices meet with leakage currents that are increasing exponentially. It therefore becomes important to reduce leakage currents in mobile apparatuses that are supplied with power from batteries.

There have been various techniques for reducing leakage currents and, thus, leakage power. Among those techniques, that of power gating, developed in recent years, is efficient for reducing leakage currents in a standby state. In the power gating technique, sleep transistors are used as switches for interrupting the power supply to circuit blocks conditioned in the standby state. Thus, it is possible to effectively reduce a rate of leakage power. Nevertheless, it is inevitable to supply power once again to a block that needs to be activated. During this process, an abrupt variation of current is induced so as to result in inadvertent noise. Such noise is called ground bounce noise, adversely affecting circuits and inducing malfunctions.

To reduce such ground bounce noise, a general power gating circuit operates by turning on sleep transistors in sequence with respective time delays. Because the sleep transistors are sequentially turned on, abrupt current variations do not occur. In order to provide, for sufficient delay, however, a chip size becomes much larger because of the many delay units that are required.

Additionally, there is a way of blocking an abrupt variation of current by connecting two sleep transistors in series and connecting a capacitor between the sleep transistors, but this may degrade chip performance because of a voltage drop due to the sleep transistors.

Therefore, a power gating circuit advantageous to chip size and functions, minimizing ground bounce noises, is needed.

SUMMARY OF THE INVENTION

Exemplary embodiments of the present invention are directed to a semiconductor IC capable of minimizing leakage currents without adverse influence from noise, and a power is control method thereof.

Exemplary embodiments of the present invention are also directed to a semiconductor IC capable of reducing a rate of power consumption, and a power control method thereof.

An exemplary embodiment of the present invention is a semiconductor IC including: a logic block; and a voltage control circuit controlling an operating voltage supplied to the logic block. The voltage control circuit controls the operating voltage to increase in a stepwise fashion during an initial operation of the logic block.

In an exemplary embodiment, the voltage control circuit includes: a power gating circuit supplying the operating voltage to the logic block; and a control block configured to control the power gating circuit in response to the operating voltage and an externally input command. The control block controls the power gating circuit to increase the operating voltage in a stepwise fashion.

In an exemplary embodiment, the power gating circuit includes: first and third transistors connected to an external power voltage and controlled by the control block; a second transistor connected between the first and third transistors and controlled by the control block; and a capacitor having one electrode that is connected to the second and third transistors and the other electrode that is grounded. A voltage of a node between the first and second transistors is supplied to the logic block as the operating voltage.

In an exemplary embodiment, the control block includes: a voltage detector detecting the operating voltage; and a controller controlling the power gating circuit in response to a detection result of the operating voltage and an external command.

In an exemplary embodiment, if there is an externally supplied voltage supply command, the controller turns the first transistor off to prevent sharing charges between the capacitor and the logic block and alternately turns the second and third transistors on.

In an exemplary embodiment, when the operating voltage reaches a reference voltage, the controller turns the first transistor on to directly supply the external power voltage to the logic block.

In an exemplary embodiment, the power gating circuit further comprises a current source connected between the external power voltage and the second transistor.

In an exemplary embodiment, in a data retention mode, the voltage control circuit controls the current source to supplement an amount of current leaking out through the logic block.

An exemplary embodiment of the present invention is a power control method of a semiconductor IC including a logic block, being comprised of: interrupting an external power voltage to the logic block in a sleep mode; supplying an operating voltage to the logic block by increasing the operating voltage in a stepwise fashion, while the sleep mode turns to an active mode; and directly supplying the external power voltage to the logic block when the operating voltage reaches a reference voltage.

An exemplary embodiment of the present invention also provides a power control method of a semiconductor IC including a logic block, being comprised of: supplying an operating voltage into the logic block; and supplementing an amount of current leaking out through the logic block so as to retain data in the logic block if the logic block turns to a data retention mode.

A further understanding of the nature and advantages of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figure 1:
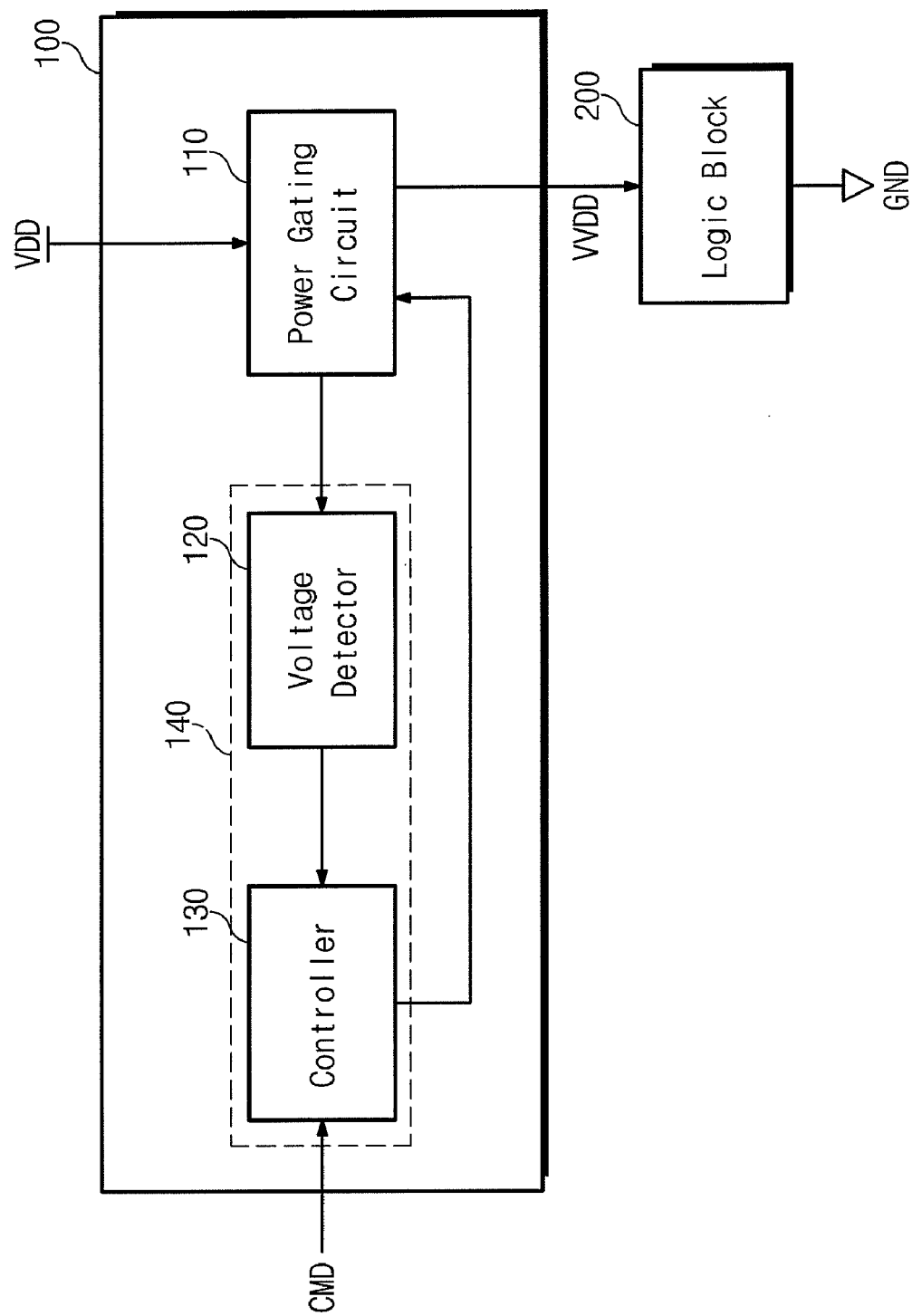
FIG. 1 is a block diagram of a semiconductor integrated circuit (IC) according to an exemplary embodiment of the present invention.

Exemplary embodiments of the present invention will be described below, involving a semiconductor IC as an example in illustrating structural and operational features provided by the present invention. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

FIG. 1 is a block diagram of a semiconductor IC according to an exemplary embodiment of the present invention.

Referring to FIG. 1, the semiconductor IC 100 in this exemplary embodiment of the present invention is comprised of a power gating circuit 110, a voltage detector 120, and a controller 130. In this exemplary embodiment, the voltage detector 120 and the controller 130 constitute a control block 140.

The power gating circuit 110 functions to supply or interrupt an external power voltage (or external power source) VDD to a logic block 200. The controller 130 operates to supply the external power voltage VDD to the logic block 200 by controlling the power gating circuit 110. A virtual voltage VVDD generated by the power gating circuit 110 is sensed through the voltage detector 120. In this exemplary embodiment, the virtual voltage VVDD means a voltage generated from the external power voltage VDD, and not supplying the external power voltage VDD directly to the logic block 200. The voltage detector 120 operates to detect the virtual voltage VVDD and outputs a detection result to the controller 130. The controller 130 then operates to control the power gating circuit 110 in response to the detection result and an external command CMD.

For the purpose of reducing a rate of power consumption throughout a system, there is no supply of the external power voltage VDD to the logic block 200 when the logic block 200 is inactive. When the logic block 200 is activated, the external voltage VDD is supplied to the logic block 200. During this occurrence, noise is induced due to an abrupt variation of the current. For that reason, the external power voltage VDD is increased in a stepwise fashion as it is supplied to the logic block 200, thereby preventing noise generation. Such a procedure for stepwise supplying the external power voltage VDD is referred to as a transient mode, which is shown in FIG. 2.

Figure 2:
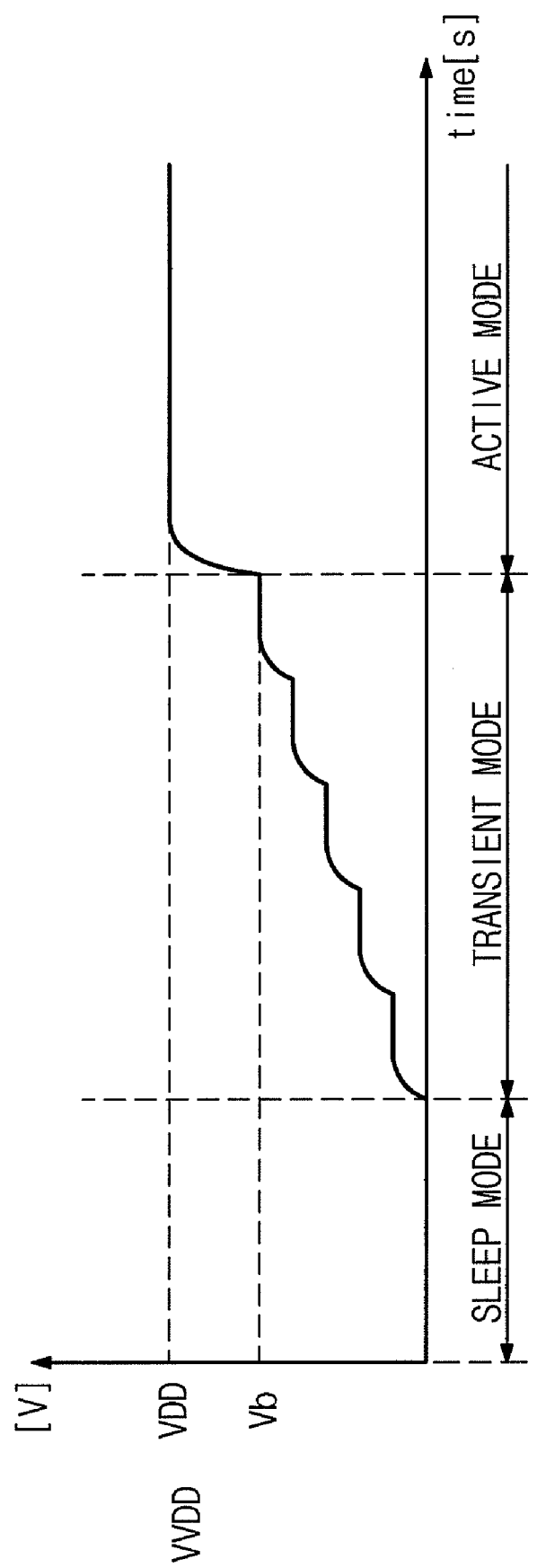
FIG. 2 is a graphic diagram of power voltage variation according to an exemplary embodiment of the present invention.

FIG. 2 is a graphic diagram of power voltage variation according to an exemplary embodiment of the present invention.

Referring to FIG. 2, in a sleep mode, there is no supply of the virtual voltage VVDD to the logic block 200. Once a power supply command CMD is externally supplied, the transient mode begins. In the transient mode, the voltage VVDD supplied into the logic block 200 increases in a stepwise fashion. When the voltage VVDD supplied to the logic block 200 reaches a reference voltage Vb, an active mode is enabled to supply the external power voltage VDD directly to the logic block 200.

In this manner, noise is restrained more than in the case that the external power voltage VDD is supplied directly to the logic block 200.

Figure 3:
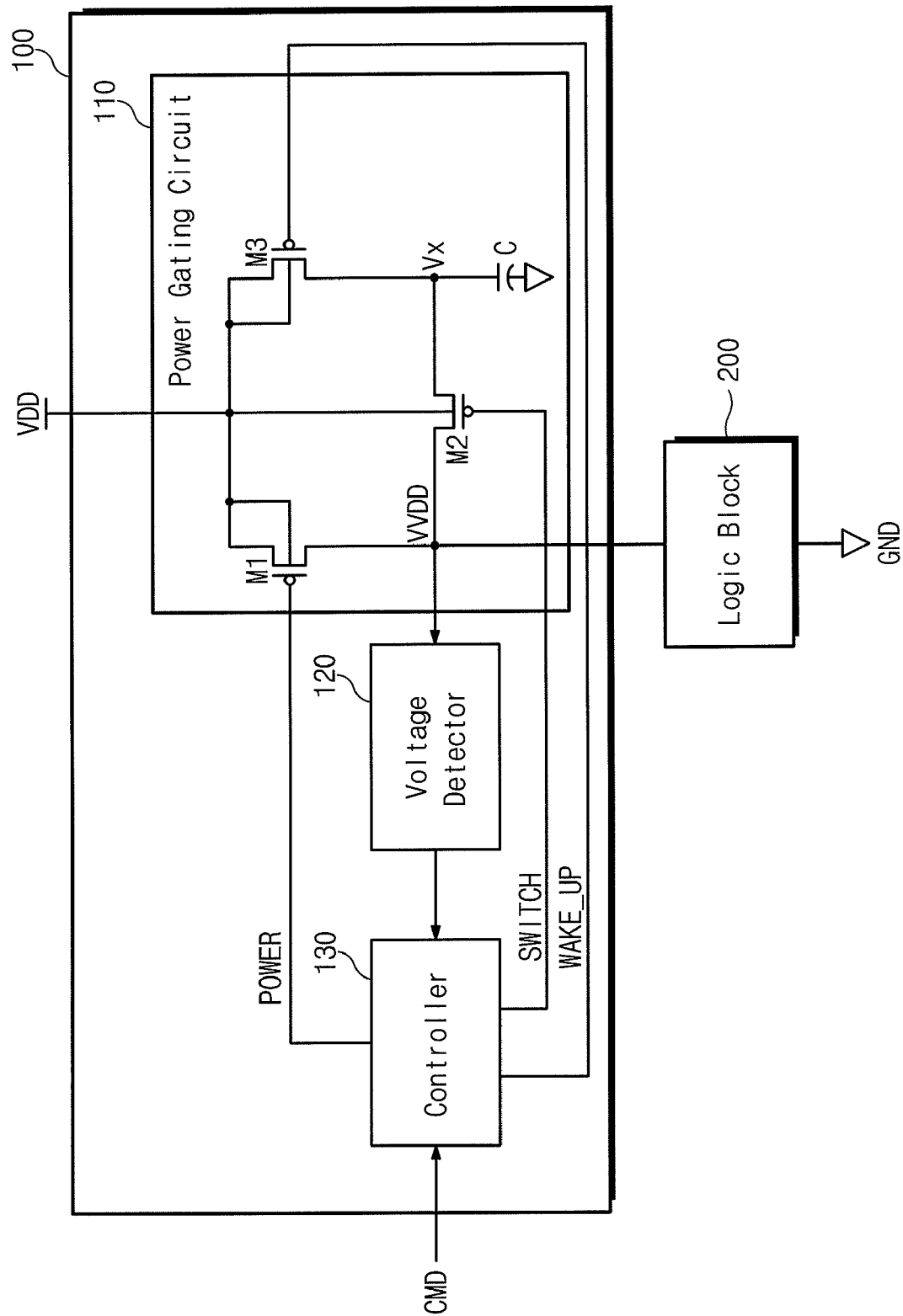
FIG. 3 is a block diagram illustrating the power gating circuit of the semiconductor IC shown in FIG. 1.

FIG. 3 is a block diagram illustrating the power gating circuit of the semiconductor IC shown in FIG. 1.

Referring to FIG. 3, the power gating circuit 110 is constructed including three transistors M1, M2, and M3, and a single capacitor C. The transistor M1 operates as a sleep transistor and the other transistors M2 and M3 operate as switches. The capacitor C may be a conventional capacitor or metal-to-metal capacitor.

Sources of the transistors M1 and M3 and substrates of the transistors M1, M2, and M3 are connected to the external power voltage VDD. A drain of the transistor M2 is connected to a drain of the transistor M1, and a source of the transistor M2 is connected to a drain of the transistor M3. One electrode of the capacitor C is coupled to a node between the transistors M2 and M3, and the other electrode of the capacitor C is grounded.

Gates of the transistors M1, M2, and M3 are coupled with respective control signals POWER, SWITCH, and WAKE_UP outputted from the controller 130.

The voltage detector 120 operates to detect the virtual voltage VVDD from a node between the transistor M1 and the transistor M2 and applies the detection result to the controller 130. The controller 130 supplies the control signals POWER, SWITCH, and WAKE_UP to the power gating circuit 110 in response to the detection result and the externally provided command CMD.

Further in regard to FIG. 3, the semiconductor IC 100 assists four modes. The four modes are sleep, transient, active, and retention. Hereinafter will be described operations of the semiconductor IC in these modes with reference to the accompanying figures.

Figure 4:
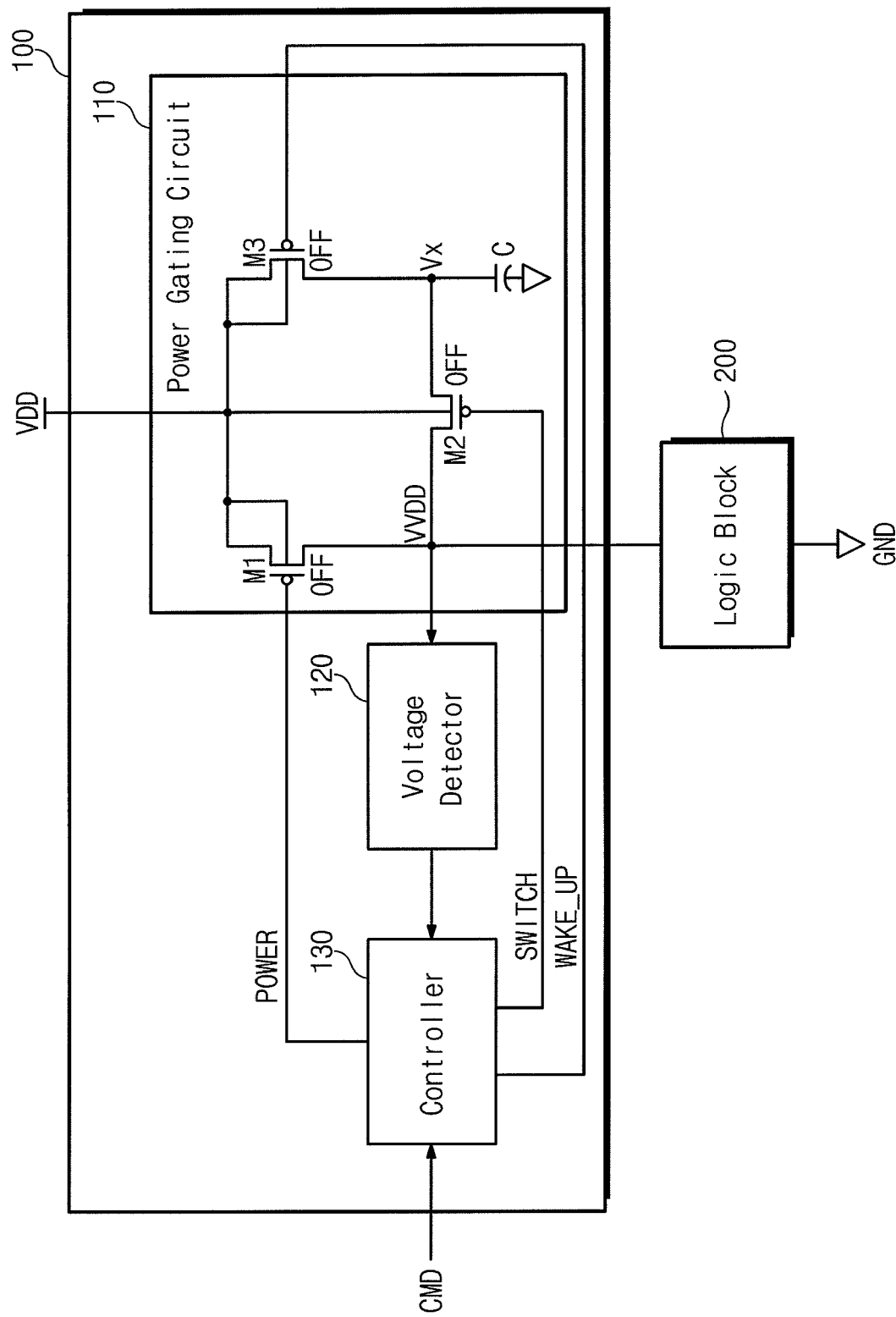
FIG. 4 is a circuit diagram showing an operating condition of the power gating circuit when the semiconductor IC is in a sleep mode.

FIG. 4 is a circuit diagram showing an operating condition of the power gating circuit when the semiconductor IC resides in the sleep mode.

Because the logic block 200 is inactivated in the sleep mode, this means that the external power voltage VDD is interrupted to the logic block 200. Thus, unnecessary power consumption does not occur and causes the system to operate in a condition of low power.

Referring to FIG. 4, if the command CMD for beginning the sleep mode is externally inputted, the controller 130 applies the control signals POWER, SWITCH, WAKE_UP to the transistors M1, M2, and M3, respectively. During this operation, the control signal POWER applied to the gate of the transistor M1 is charged to a high level of VCC. Then, the transistor M1 is turned off to interrupt the external power voltage VDD to the logic block 200, thereby restraining power leakage.

The control signal WAKE_UP applied to the gate of the transistor M3 is charged up to the high level of VCC. Then, the transistor M3 is turned off to electrically isolate the external power source VDD from the capacitor C, thereby preventing a charge inflow into the capacitor C.

The control signal SWITCH applied to the gate of the transistor M2 is charged up to the high level of VCC. Then, the transistor M2 is turned off to electrically isolate the capacitor C from the logic block 200, thereby preventing charges from moving toward the logic block 200 from the capacitor C.

As a result, when the semiconductor IC resides in the sleep mode, it is possible to restrain power leakage because the external power source VDD is completely isolated from the logic block 200.

Figure 5:
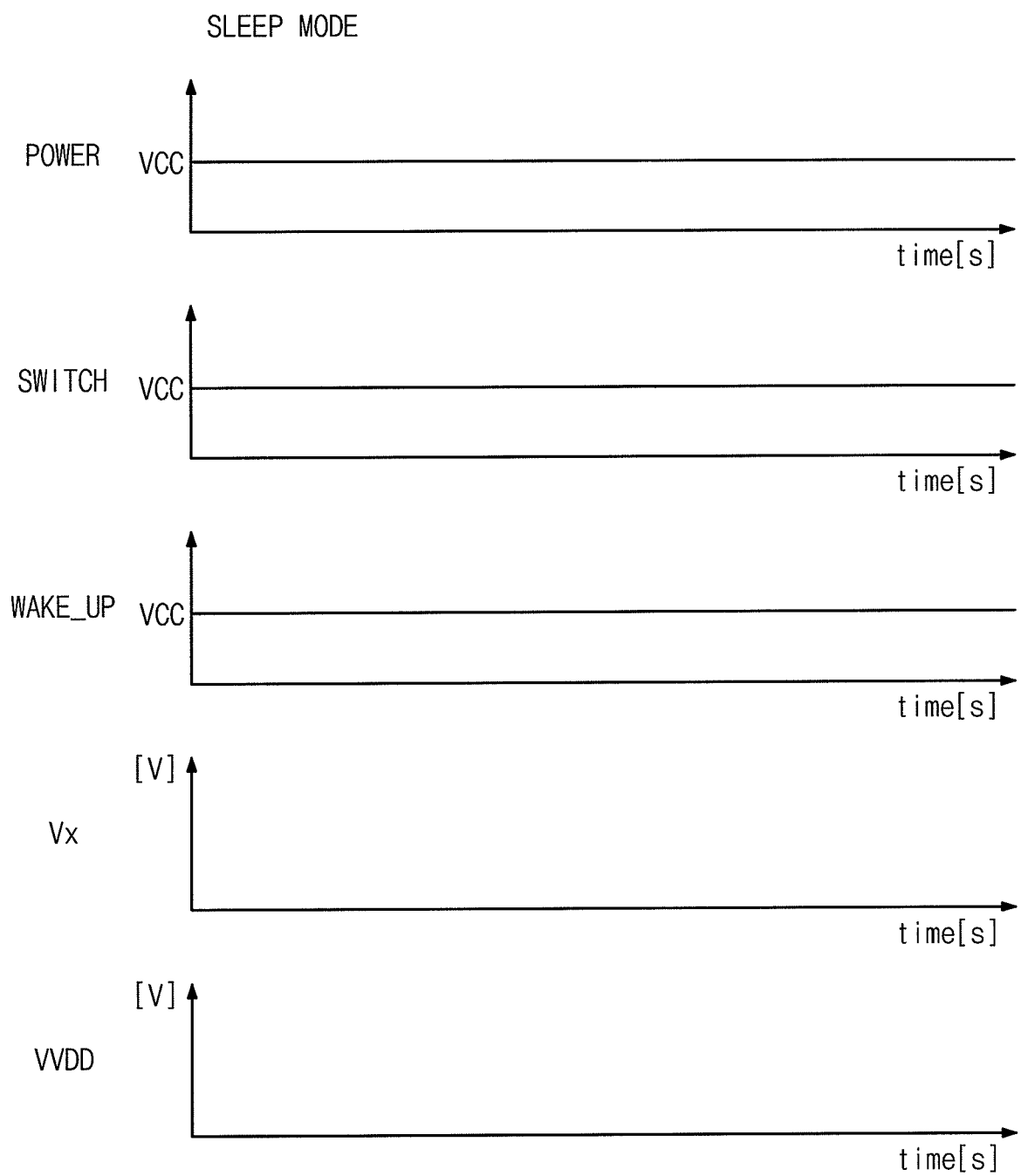
FIG. 5 is a timing diagram of control signals when the semiconductor IC is in the sleep mode.

FIG. 5 is a timing diagram of the control signals when the semiconductor IC is in the sleep mode.

Referring to FIG. 5, the control signals POWER, SWITCH, and WAKE_UP applied each to the gates of the three transistors M1, M2, and M3, respectively, of the power gating circuit 110 are charged to the high level of VCC. Thus, the three transistors M1, M2, and M3 are turned off to interrupt connection between the external power source VDD and the logic block 200. This causes a capacitor voltage Vx and the virtual voltage VVDD to be 0V, thereby radically preventing current leakage through the logic block 200.

Figure 6:
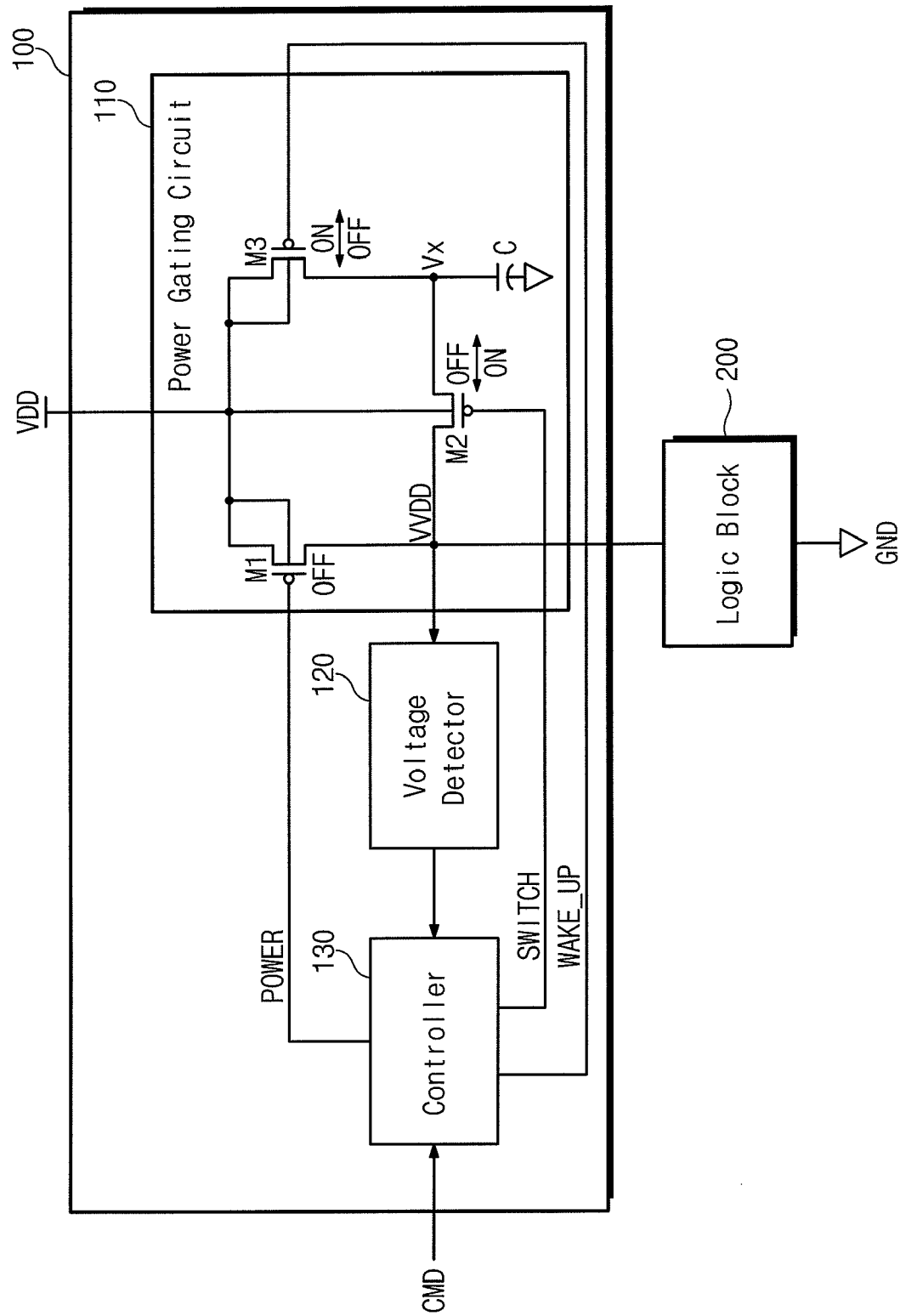
FIG. 6 is a circuit diagram showing an operating condition of the power gating circuit when the semiconductor IC is in a transient mode.

FIG. 6 is a circuit diagram showing an operating condition of the power gating circuit 110 when the semiconductor IC is in the transient mode.

A power gating circuit 110 supplies the external power voltage VDD to the logic block 200 when the sleep mode transitions to the active mode. During this, an abrupt variation of current occurs to generate noise in the logic block 200. This phenomenon can be explained by Faraday's law. As Faraday's law is well known, it will not be further detailed in the interest of brevity. For that reason, the transient mode is used for preventing an abrupt variation of current that is caused while the sleep mode transitions to the active mode.

Referring to FIG. 6, if the command CMD for power supply is externally inputted, the transient mode begins. The controller 130 applies the control signals POWER, WAKE_UP, and SWITCH to the transistors M1, M2, and M3, respectively, in response to the power supply command CMD.

In the transient mode, the control signal POWER applied to the gate of the transistor M1 is charged up to the high level of VCC. Then, the transistor M1 is turned off. As in the sleep mode, there is no supply of the external power voltage VDD to the logic block 200.

The control signal WAKE_UP applied to the gate of the transistor M3 oscillates between a low level of 0V and the high level of VCC. The transistor M3 is alternately turned on and off in response to the control signal WAKE_UP. Thereby, the external power source VDD is repeatedly connected and disconnected to the capacitor C. If the external power source VDD is connected to the capacitor C, charges are stored in the capacitor C.

The control signal SWITCH applied to the gate of the transistor M2 oscillates between the high level of VCC and the low level of 0V. The transistor M2 is turned on and off alternately in response to the control signal SWITCH. Thereby, the capacitor C is repeatedly connected and disconnected to the logic block 200.

The control signals applied to the transistors M2 and M3 are contrary to each other in logic level. For instance, the control signal SWITCH is set to the high level of VCC, while the control signal WAKE_UP is laid on the low level of 0V. Thereby, the two transistors M2 and M3 are alternately turned on.

Figure 7:
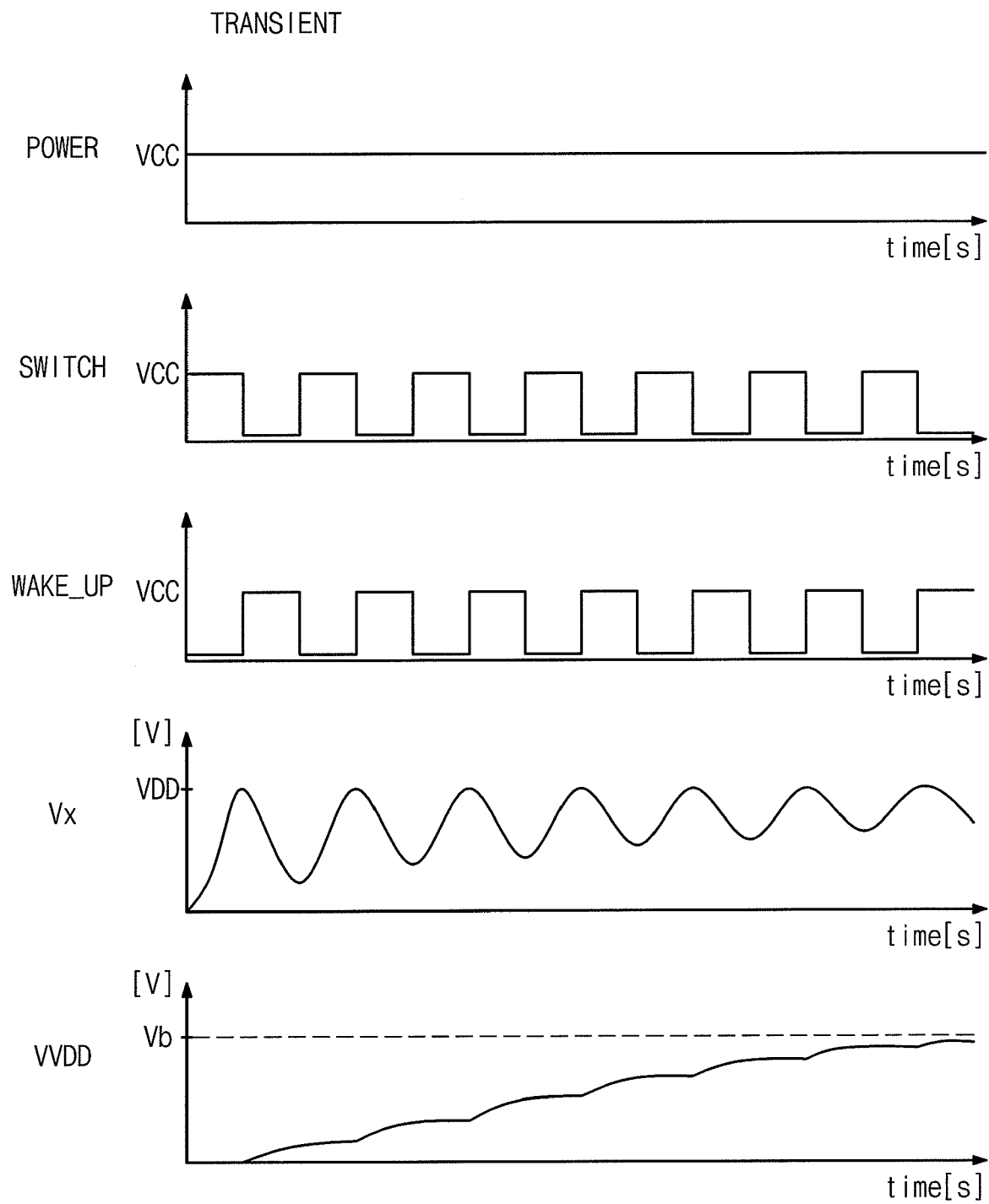
FIG. 7 is a timing diagram of the control signals when the semiconductor IC is in the transient mode.

FIG. 7 is a timing diagram of the control signals when the semiconductor IC is in the transient mode.

Referring to FIG. 7, the control signals POWER, SWITCH, and WAKE_UP applied to the gates of the three transistors M1, M2, and M3, respectively, of the power gating circuit 110 are variable in logic value over time.

First, the control signal POWER applied to the gate of the transistor M1 maintains the high level of VCC. Then, the transistor M1 is turned off. As a result, there is no supply of the external power voltage VDD to the logic block 200.

The control signal WAKE_UP applied to the gate of the transistor M3 oscillates, from the low level of 0V, between the low level of 0V and the high level of VCC. The transistor M3 is repeatedly turned on and off from the turn-on state in response to the control signal WAKE_UP. Thereby, the external power source VDD is repeatedly connected and disconnected to the capacitor C.

Furthermore, the control signal SWITCH applied to the gate of the transistor M2 oscillates, from the high level of VCC, between the high level of VCC and the low level of 0V. The transistor M2 is alternately turned off and on in response to the control signal SWITCH. Thereby, the capacitor C is repeatedly disconnected and connected to the logic block 200.

As can be seen from FIG. 7, the control signals applied to the transistors M2 and M3, SWITCH and WAKE_UP, are contrary to each other in logic level. For instance, the control signal SWITCH is set to the high level of VCC while the control signal WAKE_UP is laid on the low level of 0V. Thereby, the two transistors M2 and M3 are alternately turned on.

When the control signal WAKE_UP is laid on the low level of 0V and the control signal SWITCH is charged up to the high level of VCC, the capacitor voltage Vx rises up to the same level as the external power voltage VDD. More specifically, if the control signal WAKE_UP is laid on the low level of 0V, the transistor M3 is turned on to connect the external power source VDD to the capacitor C. Then, the capacitor C is charged by the external power voltage VDD. If the control signal SWITCH is set to the high level of VCC, the capacitor C is electrically isolated from the logic block 200. Then, charges do not move into the logic block 200.

On the other hand, the capacitor voltage Vx drops if the control signal WAKE_UP is charged up to the high level of VCC and the control signal SWITCH is laid on the low level of 0V. More specifically, if the control signal WAKE_UP is set to the high level of VCC, the transistor M3 is turned off to electrically disconnect the external power source VDD from the capacitor C. If the control signal SWITCH is laid on the low level of 0V, the capacitor C is connected to the logic block 200. During this time, the charge sharing occurs. Thereby, charges move to a node of the virtual voltage VVDD from the capacitor C. The phrase charge sharing means the mechanism whereby capacitors connected with each other in series divisionally store charges. Referring to $C_1[F]$ as the electric capacity of the capacitor C, Ceq[F] as the equivalent electric capacity at the node of the virtual voltage VVDD, and Vcs[V] as a voltage after the charge sharing has occurred, an equality is given as follows.

$$C1 Vx + Ceq VVDD = (C1 + Ceq) Vcs$$

This can be arranged for Vcs, $$Vcs = \frac{C1}{C1 + Ceq} Vx + \frac{Ceq}{C1 + Ceq} VVDD$$

In general, because Ceq is larger than $C_1$(Ceq>>$C_1$), the virtual voltage VVDD is smaller than the capacitor voltage Vx in range of variation.

The virtual voltage VVDD rises when the control signal WAKE_UP is set on the high level of VCC, and the control signal SWITCH is set on the low level of 0V. During this time, the virtual voltage VVDD becomes higher through the charge sharing between the capacitor C and the logic block 200. Subsequently, when the control signal WAKE_UP is laid on the low level of 0V and the control signal SWITCH is charged up to the high level of VCC, the transistor M2 is turned off to block the charge inflow into the node of the virtual voltage VVDD. Thus, the is virtual voltage VVDD maintains its existing level.

Because the virtual voltage VVDD rises stepwise, not abruptly, it is able to reduce noise that is caused by an abrupt variation of the voltage.

Figure 8:
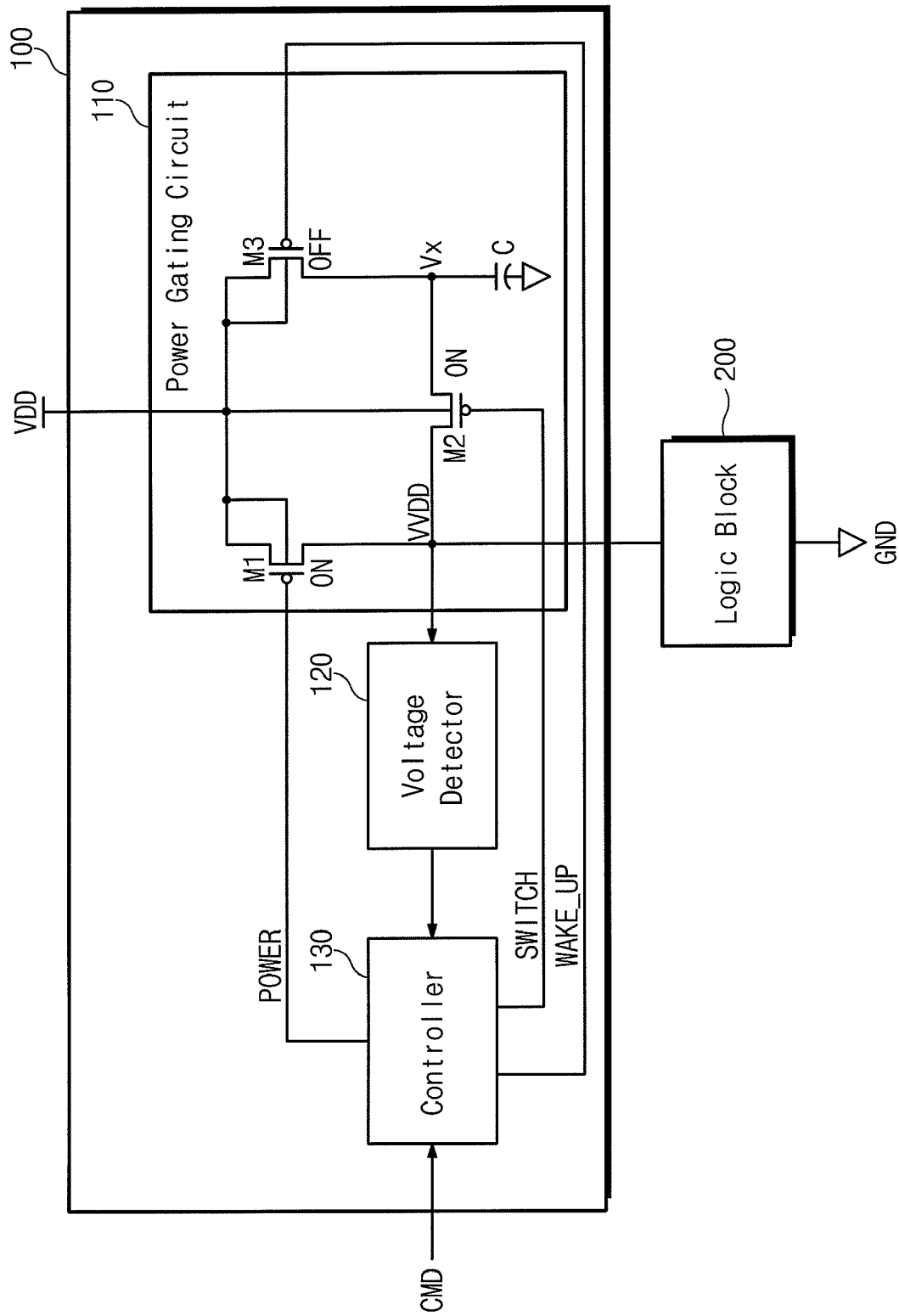
FIG. 8 is a circuit diagram showing an operating condition of the power gating circuit when the semiconductor IC is in an active mode.

FIG. 8 is a circuit diagram showing an operating condition of the power gating circuit 110 when the semiconductor IC is in the active mode.

The active mode is a mode where the logic block 200 is normally operating. In the active mode, an operating voltage is supplied to the logic block 200 for activation. The controller 130 functions to control the automatic transition from the transient mode to the active mode when the virtual voltage VVDD reaches a predetermined level.

More specifically, the voltage detector 120 operates to detect the virtual voltage VDD and transfers a detection result to the controller 130. The controller 130 changes an operation mode from the transient mode to the active mode when the detection result reaches a predetermined level of the reference voltage Vb shown in FIG. 7. The level of the reference voltage Vb can be established by a user. It is preferred for the reference voltage Vb to be set lower than the operating voltage, because the virtual voltage VVDD takes a long time to reach the operating voltage in the transient mode.

In the active mode, the control signal POWER applied to the gate of the transistor M1 is set to the low level of 0V. Thus, the transistor M1 is turned on. Then, the external power voltage VDD is supplied directly to the logic block 200.

The control signal WAKE_UP applied to the gate of the transistor M3 is set to the high level of VCC. Thus, the transistor M3 is turned off. Then, the external power source VDD is electrically isolated from the capacitor C.

Furthermore, the control signal SWITCH applied to the gate of the transistor M2 is set to the low level of 0V. Thus, the transistor M2 is turned on. Then, the capacitor C is coupled to the logic block 200.

According to the transistor M2 being turned on, the capacitor voltage Vx is charged up to the same level as the external power voltage VDD. According to the transistor M1 being turned on, the virtual voltage VVDD is charged up to the same level as the external power voltage VDD. Furthermore, the charge sharing occurs between the logic block 200 and the capacitor C when the external power source VDD is connected to the logic block 200. In this exemplary embodiment, the capacitor C may be implemented as a kind of low-pass filter (LPF). Hence, it restrains noise flowing thereinto along with the external power voltage VDD.

Figure 9:
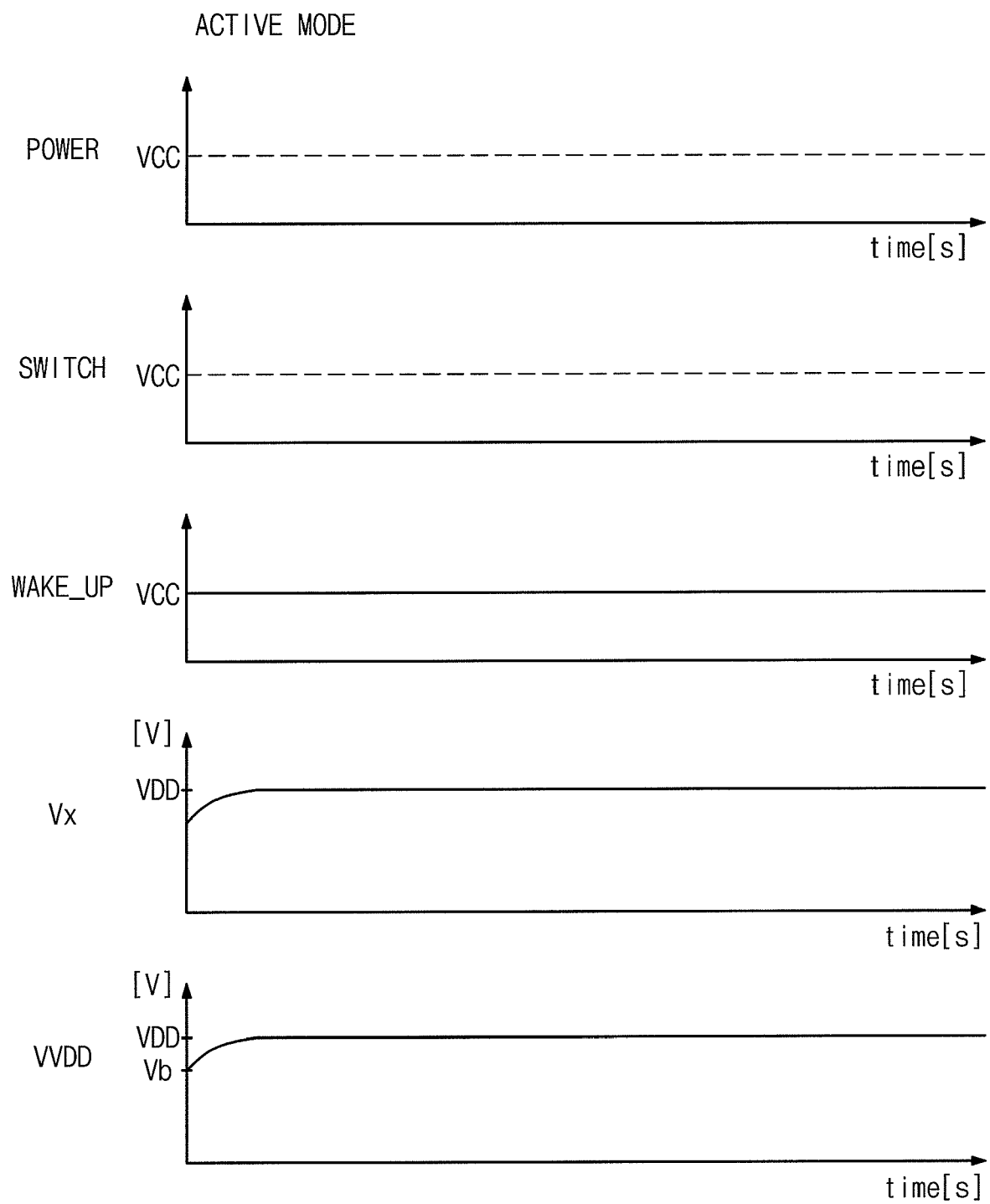
FIG. 9 is a timing diagram of the control signals when the semiconductor IC is in the active mode.

FIG. 9 is a timing diagram of the control signals when the semiconductor IC is in the active mode.

Referring to FIG. 9, the control signals POWER, SWITCH, and WAKE_UP applied to the gates of the three transistors M1, M2, and M3, respectively, of the power gating circuit 110 are different from each other in logic level.

The control signal POWER applied to the gate of the transistor M1 is set to the low level of 0V. Thus, the transistor M1 is turned on. Then, the external power voltage VDD is supplied to the logic block 200.

The control signal WAKE_UP applied to the gate of the transistor M3 is charged up to the high level of VCC. Thus, the transistor M3 is turned off. Then, the external power source VDD is electrically disconnected from the capacitor C.

Furthermore, the control signal SWITCH applied to the gate of the transistor M2 is set on the low level of 0V. Thus, the transistor M2 is turned on. Then, the capacitor C is connected to the logic block 200. As the transistor M2 is turned on, the capacitor voltage Vx has the same is voltage as the external power voltage VDD. Furthermore, as the transistor M1 is turned on, the virtual voltage VVDD is set on the same level as the external power voltage VDD.

Figure 10:
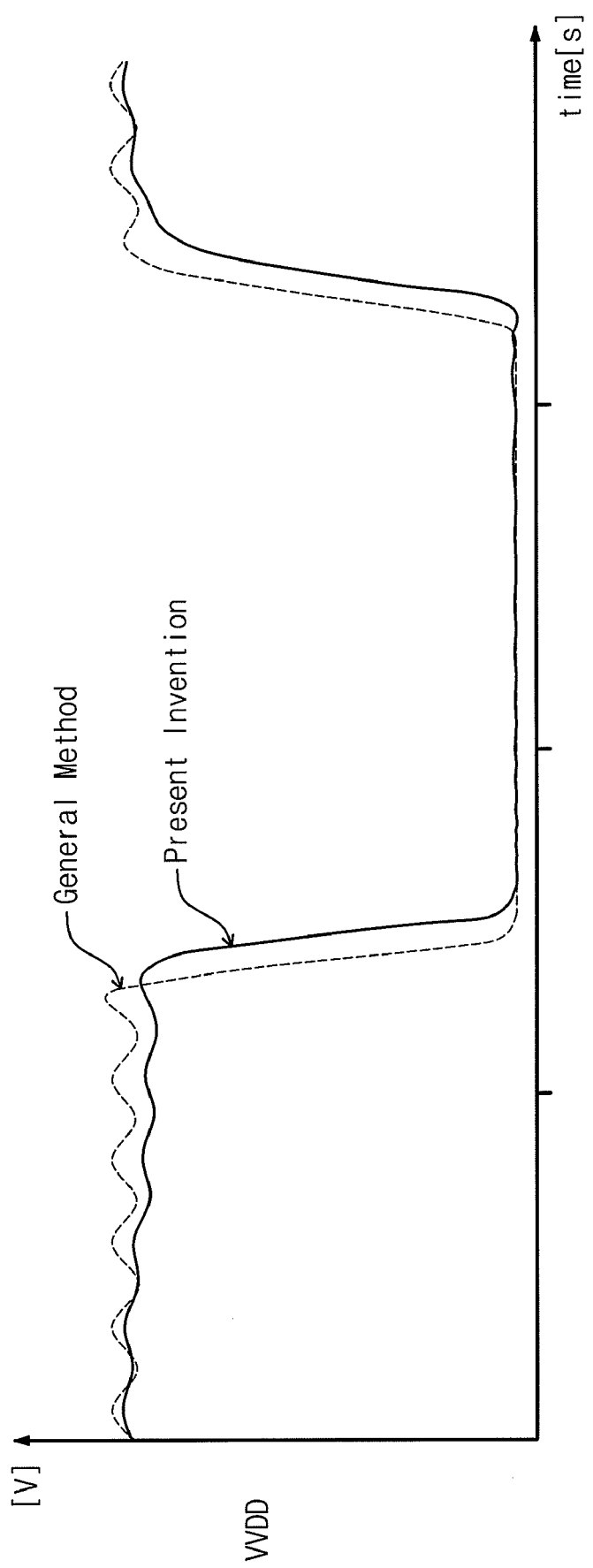
FIG. 10 is a graphic diagram showing an effect of reducing noise when the semiconductor IC operates in the active mode.

FIG. 10 is a graphic diagram showing an effect of reducing noise when the semiconductor IC operates in the active mode according to an exemplary embodiment of the present invention.

Referring to FIG. 10, in the semiconductor IC according to an exemplary embodiment of the present invention, an output voltage is lower than that of a general power gating circuit, but it can be seen that noise due to the external power voltage VDD is reduced more than in the general method. This is because the capacitor C acts as an LPF for reducing noise components flowing thereinto along with the external power voltage VDD. As is well known, the LPF interrupts high-frequency components and passes low-frequency components.

Figure 11:
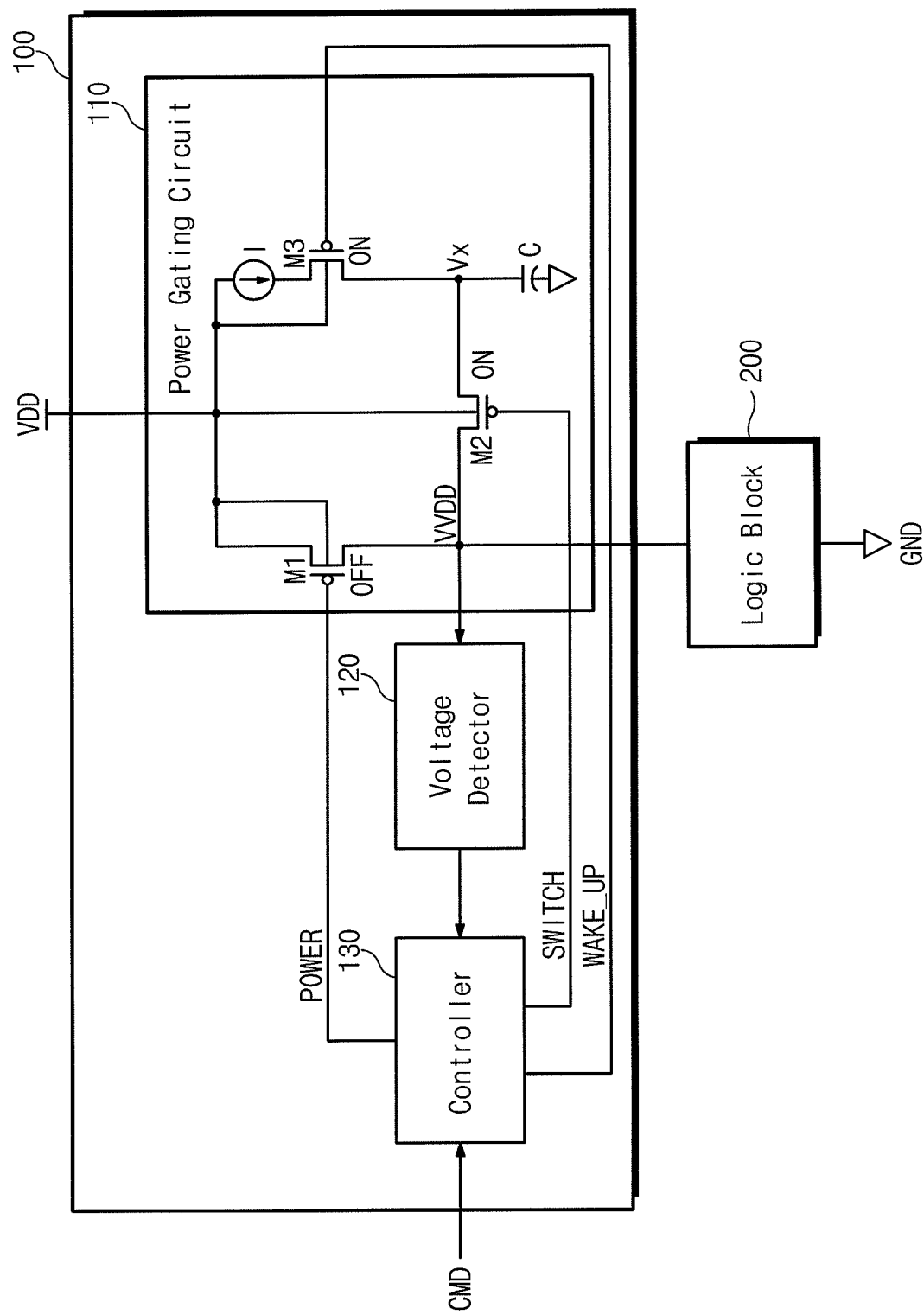
FIG. 11 is a circuit diagram showing an operating condition of the power gating circuit when the semiconductor IC is in a retention mode.

FIG. 11 is a circuit diagram showing an operating condition of the power gating circuit when the semiconductor IC is in a retention mode.

As aforementioned, the power gating technology is used for reducing a rate of leakage power by interrupting the supply of the external power voltage VDD toward the logic block 200 that is being held inactive. If the supply of the external power voltage VDD is completely interrupted in the sleep mode, however, all data that is stored vanishes. Accordingly, there is typically an additional process for backing-up and restoring data, to prevent degrading systemic performance. In an exemplary embodiment of the present invention, a retention mode is used for improving systemic performance by skipping the process of data back-up and restoration. In other words, the retention mode is conducted to reduce a rate of power consumption more than the active mode, yet maintaining data by supplying the least amount of power necessary for retaining data in the logic block 200.

In order to execute the retention mode, the power gating circuit 110 further includes a current source I. The current source I functions to supplement an amount of current leaking out through the logic block 200. Although not shown in the figures, an amount of current flowing from the current source I is regulated by the controller 130. For instance, the current source I may be formed of a transistor (not shown) operating under control of the controller 130. The transistor of the current source I is required to be fully turned on in order to conduct the transient mode.

Figure 12:
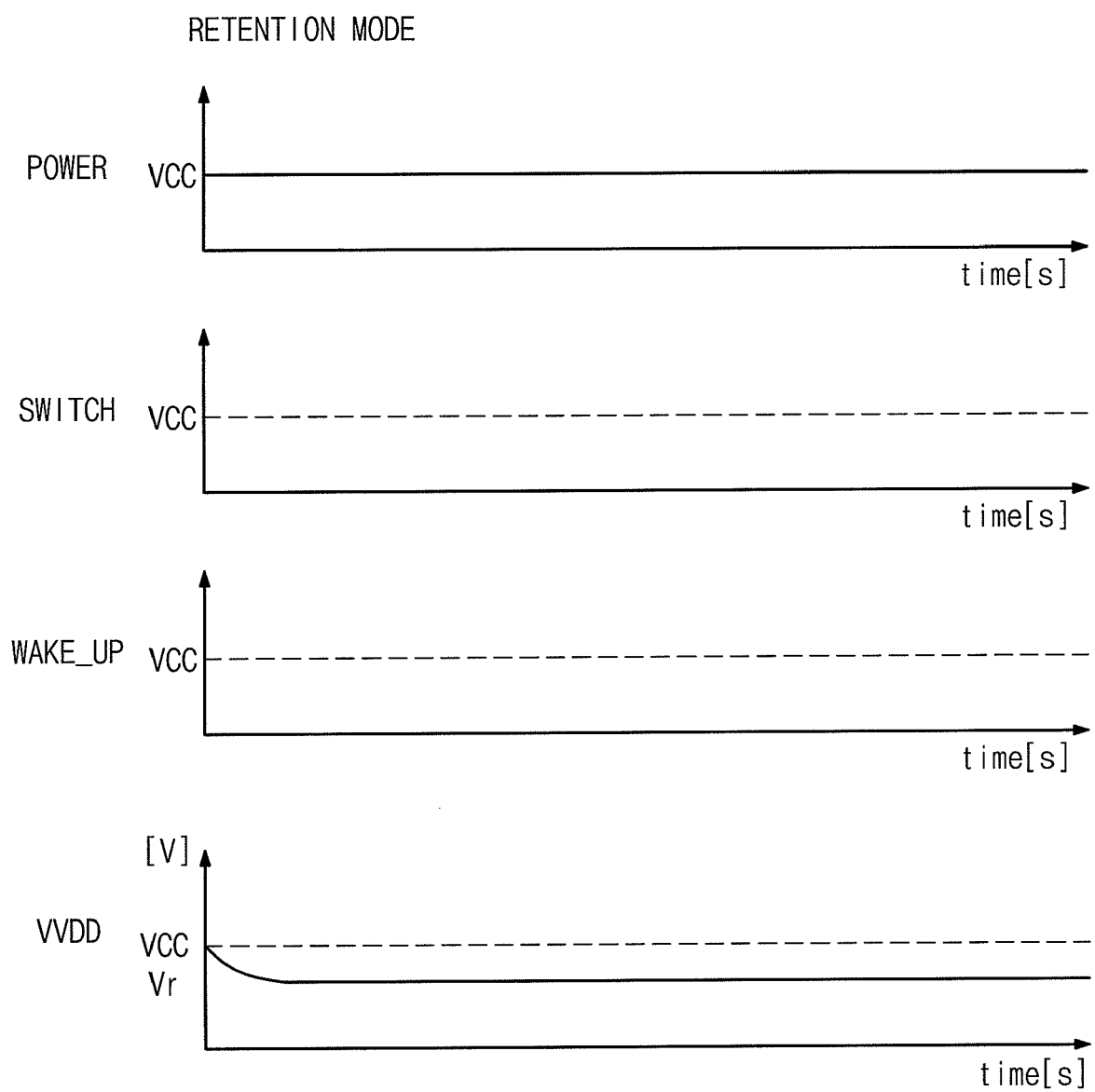
FIG. 12 is a timing diagram of the control signals when the semiconductor IC is in the retention mode.

The controller 130 increases an amount of current flowing from the current source I if the virtual voltage VVDD is detected as being lower than a retention voltage Vr, shown in FIG. 12. Furthermore, the controller 130 decreases an amount of current flowing from the current source I when the virtual voltage VVDD is detected as being higher than the retention voltage Vr.

If there is an input of the retention mode beginning command CMD, the controller 130 generates the control signals POWER, WAKE_UP, and SWITCH for controlling the transistors M1, M2, and M3, respectively. The control signal POWER applied to the gate of the transistor M1 is charged up to the high level of VCC. Thus, the transistor M1 is turned off. Then, the external power voltage VDD is interrupted to the logic block 200.

The control signal WAKE_UP applied to the gate of the transistor M3 is laid on the low level of 0V. Thus, the transistor M3 is turned on to connect the external power source VDD with the capacitor C.

Furthermore, the control signal SWITCH applied to the gate of the transistor M2 is set to the low level of 0V. Thus, the transistor M2 is turned on to connect the capacitor C with the logic block 200.

Because the transistors M2 and M3 are turned on, the node of the virtual voltage VVDD has a current flowing from the current source I. The current flowing from the current source I acts to supplement an amount of current leaking out through the logic block 200. The virtual voltage VVDD is determined by the amount of current flowing from the current source I. The virtual voltage VVDD is set on the least level in the range capable of retaining data in the logic block 200, which is referred as the retention voltage Vr. The retention voltage Vr may be predetermined or adjusted to a level proper to a system condition. For example, if the system temperature elevates, it is necessary to raise the retention voltage Vr because an amount of current leaking out through the logic block 200 becomes larger.

As aforementioned, it is possible to obtain a power gain as much as a gap between the operating voltage and the retention voltage Vr, by maintaining data with a voltage lower than the operating voltage in the logic block 200.

FIG. 12 is a timing diagram of the control signals when the semiconductor IC is staying in the retention mode according to an exemplary embodiment of the present invention.

Referring to FIG. 12, the control signals POWER, SWITCH, and WAKE_UP applied each to the three transistors M1, M2, and M3, respectively, of the power gating circuit 110 are different in logic level.

The control signal POWER applied to the gate of the transistor M1 is charged up to the high level of VCC. Thus, the transistor M1 is turned off. Then, the external power voltage VDD is interrupted to the logic block 200.

The control signals WAKE_UP and SWITCH applied respectively to the gates of the transistors M3 and M2 are set on the low level of 0V. Thus, the transistors M2 and M3 are turned on. Then, a current flows into the logic block 200 from the current source I. The current flowing thereinto supplements an amount of current leaking out through the logic block 200. By adjusting an amount of current flowing from the current source I, it is possible to regulate the virtual voltage VVDD on the same level with the retention voltage Vr.

Therefore, it is possible to obtain a voltage gain as much as a gap between the operating voltage and the retention voltage Vr, thereby retaining data in the logic block 200.

As described above, noise induced from an abrupt variation of the current amount is reduced by increasing the external power voltage supplied into the logic block in a stepwise fashion.

Moreover, it is possible to result in a power gain by supplying the logic block 200 only with the least voltage capable of retaining data therein.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor IC comprising:
a logic block; and
a voltage control circuit controlling an operating voltage supplied to the logic block,
wherein the voltage control circuit controls the operating voltage to increase in a stepwise fashion during each transient mode from a sleep mode to an active mode of the logic block,
wherein the voltage control circuit comprises:
a power gating circuit controllably supplying the operating voltage to the logic block; and
a control block configured to control the power gating circuit in response to the operating voltage and an externally input command,
wherein the control block controls the power gating circuit to increase the operating voltage in the stepwise fashion,
wherein the power gating circuit comprises:
first and third transistors connected to an external power voltage and controlled by the control block;
a second transistor connected between the first and third transistors and controlled by the control block; and
a capacitor having one electrode connected to the second and third transistors and the other electrode connected to the ground,
wherein a voltage of a node between the first and second transistors is supplied to the logic block as the operating voltage,
wherein the control block comprises:
a voltage detector detecting the operating voltage; and
a controller controlling the power gating circuit in response to a detection result of the operating voltage and the command,
wherein when the operating voltage reaches a reference voltage, the controller turns the first transistor on to directly supply the external power voltage to the logic block.

2. The semiconductor IC as set forth in claim 1, wherein when there is an externally supplied voltage supply command, the controller turns the first transistor off for sharing charges between the capacitor and the logic block and alternately turns the second and third transistors on.

3. The semiconductor IC as set forth in claim 1, wherein the power gating circuit further comprises a current source connected between the external power voltage and the second transistor.

4. The semiconductor IC as set forth in claim 3, wherein in a data retention mode, the voltage control circuit controls the current source to supplement an amount of current leaking out through the logic block.

* * * * *

UNITED STATES PATENT AND TRADEMARK OFFICE
CERTIFICATE OF CORRECTION

PATENT NO. : 7,659,773 B2 Page 1 of 1
APPLICATION NO. : 12/022680
DATED : February 9, 2010
INVENTOR(S) : Chang-Jun Choi and Suhwan Kim It is certified that error appears in the above-identified patent and that said Letters Patent is hereby corrected as shown below:

On the Title page

Item (73) Assignee should read as follows: Samsung Electronics Co., Ltd. and Seoul National University Industry Foundation Signed and Sealed this First Day of June, 2010

David J. Kappos
*Director of the United States Patent and Trademark Office*